United States Patent
Palanduz et al.

(10) Patent No.: US 7,375,412 B1
(45) Date of Patent: May 20, 2008

(54) ITFC WITH OPTIMIZED C(T)

(75) Inventors: Cengiz A. Palanduz, Chandler, AZ (US); Dustin P. Wood, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/096,313

(22) Filed: Mar. 31, 2005

(51) Int. Cl.
*H01L 29/00* (2006.01)

(52) U.S. Cl. .............. 257/532; 257/300; 257/700; 257/703; 257/705

(58) Field of Classification Search .............. 257/532, 257/296, 298, 303, 306, 307, 516, 300, 700, 257/703, 705, E39.015, E39.018
See application file for complete search history.

(56) References Cited

U.S. PATENT DOCUMENTS

| | | | |
|---|---|---|---|
| 4,241,378 A | 12/1980 | Dorrian | |
| 4,458,295 A | 7/1984 | Durschlag et al. | |
| 4,528,613 A | 7/1985 | Stetson et al. | |
| 4,687,540 A | 8/1987 | Singhdeo et al. | |
| 5,065,275 A | 11/1991 | Fujisaki et al. | |
| 5,155,655 A | 10/1992 | Howard et al. | |
| 5,160,762 A | 11/1992 | Brand et al. | |
| 5,172,304 A | 12/1992 | Ozawa et al. | |
| 5,177,670 A | 1/1993 | Shinohara et al. | |
| 5,191,510 A | 3/1993 | Huffman | |
| 5,206,788 A | 4/1993 | Larson et al. | |
| 5,745,334 A * | 4/1998 | Hoffarth et al. | ............ 361/313 |
| 5,796,572 A | 8/1998 | Kawai | |
| 5,800,575 A | 9/1998 | Lucas | |
| 5,889,647 A | 3/1999 | Hansen et al. | |
| 5,912,044 A | 6/1999 | Farooq et al. | |
| 5,978,207 A | 11/1999 | Anderson et al. | |
| 6,043,973 A | 3/2000 | Nagashima et al. | |

(Continued)

FOREIGN PATENT DOCUMENTS

EP 0977218 2/2000

(Continued)

OTHER PUBLICATIONS

PCT Search Report and Written Opinion for PCT Appln. No. PCT/US2005/037626, mailed May 8, 2006 (9 pages).

(Continued)

*Primary Examiner*—Evan Pert
*Assistant Examiner*—Tan N Tran
(74) *Attorney, Agent, or Firm*—Blakely, Sokoloff, Taylor & Zafman LLP

(57) ABSTRACT

A method including depositing a suspension of a colloid comprising an amount of nano-particles of a ceramic material on a substrate; and thermally treating the suspension to form a thin film. A method including depositing a plurality of nano-particles of a ceramic material to pre-determined locations across a surface of a substrate; and thermally treating the plurality of nano-particles to form a thin film. A system including a computing device comprising a microprocessor, the microprocessor coupled to a printed circuit board through a substrate, the substrate comprising at least one capacitor structure formed on a surface, the capacitor structure comprising a first electrode, a second electrode, and a ceramic material disposed between the first electrode and the second electrode, wherein the ceramic material comprises columnar grains.

15 Claims, 11 Drawing Sheets

U.S. PATENT DOCUMENTS

| | | | |
|---|---|---|---|
| 6,058,004 | A | 5/2000 | Duva et al. |
| 6,178,082 | B1 | 1/2001 | Farooq et al. |
| 6,216,324 | B1 | 4/2001 | Farooq et al. |
| 6,226,172 | B1 | 5/2001 | Sato et al. |
| 6,351,368 | B1 * | 2/2002 | Kim ............................. 361/302 |
| 6,372,286 | B1 | 4/2002 | Azuma et al. |
| 6,433,993 | B1 | 8/2002 | Hunt et al. |
| 6,437,970 | B1 | 8/2002 | Lee et al. |
| 6,477,034 | B1 | 11/2002 | Chakravorty et al. |
| 6,524,352 | B2 | 2/2003 | Adae-Amoakoh et al. |
| 6,541,137 | B1 | 4/2003 | Kingon et al. |
| 6,623,865 | B1 | 9/2003 | Zou et al. |
| 6,631,551 | B1 | 10/2003 | Bowles et al. |
| 6,638,378 | B2 | 10/2003 | O'Bryan et al. |
| 6,672,912 | B2 * | 1/2004 | Figueroa ..................... 439/862 |
| 6,775,150 | B1 | 8/2004 | Chakravorty et al. |
| 6,795,296 | B1 | 9/2004 | Palanduz et al. |
| 6,980,416 | B2 | 12/2005 | Sakaguchi et al. |
| 7,072,167 | B2 | 7/2006 | Borland |
| 2001/0019144 | A1 | 9/2001 | Roy |
| 2001/0054748 | A1 | 12/2001 | Wikborg et al. |
| 2002/0080551 | A1 | 6/2002 | Kitagawa et al. |
| 2003/0016026 | A1 * | 1/2003 | Kawaike et al. ............ 324/537 |
| 2003/0136997 | A1 | 7/2003 | Shioga et al. |
| 2003/0184953 | A1 | 10/2003 | Lee et al. |
| 2003/0207150 | A1 | 11/2003 | Maria et al. |
| 2003/0230768 | A1 * | 12/2003 | Seitz ........................... 257/200 |
| 2004/0027813 | A1 * | 2/2004 | Li ................................ 361/767 |
| 2004/0065912 | A1 | 4/2004 | Liu et al. |
| 2004/0081811 | A1 | 4/2004 | Casper et al. |
| 2004/0089471 | A1 * | 5/2004 | Andoh et al. ................ 174/262 |
| 2004/0126484 | A1 | 7/2004 | Croswell et al. |
| 2004/0175585 | A1 | 9/2004 | Zou et al. |
| 2004/0257749 | A1 | 12/2004 | Otsuka et al. |
| 2005/0011857 | A1 | 1/2005 | Borland et al. |
| 2005/0118482 | A1 | 6/2005 | Sriramulu et al. |
| 2005/0151156 | A1 | 7/2005 | Wu et al. |
| 2006/0099803 | A1 | 5/2006 | Min |
| 2006/0143886 | A1 * | 7/2006 | Srinivasan et al. ......... 29/25.41 |

FOREIGN PATENT DOCUMENTS

| | | |
|---|---|---|
| JP | 02-005507 | 1/1990 |
| JP | 03-178112 | 8/1991 |
| JP | 07-122456 | 5/1995 |
| JP | 2002-297939 | 10/2001 |
| JP | 2002-305125 | * 10/2002 |

OTHER PUBLICATIONS

Felten, J, et al.: Embedded Ceramic Resistors and Capacitors in PWB: Process and Performance; http://edc.ncms.org/ (2004) 7 pages.

Offerman, SE, et al.: Grain Nucleation and Growth During Phase Transformations; Science (2002) 298-1003-1005.

Office Action for U.S. Appl. No. 11/172,544, mailed Dec. 15, 2006 (12 pages).

Office Action for U.S. Appl. No. 10/974,139, mailed Dec. 13, 2006 (11 pages).

Office Action for U.S. Appl. No. 10/971,829, mailed Jan. 3, 2007 (8 pages).

Office Action for U.S. Appl. No. 10/882,745, mailed Mar. 17, 2005 (12 pgs).

Office Action for U.S. Appl. No. 10/882,745, mailed Oct. 4, 2005 (10 pgs).

Office Action for U.S. Appl. No. 10/882,745, mailed Apr. 3, 2006 (9 pgs).

Office Action for U.S. Appl. No. 10/882,745, mailed Aug. 30, 2006 (12 pgs).

Office Action for U.S. Appl. No. 10/882,745, mailed Jan. 10, 2007 (13 pgs).

Office Action for U.S. Appl. No. 10/882,745, mailed May 1, 2007 (12 pgs).

Office Action for U.S. Appl. No. 10/971,829, mailed Mar. 8, 2006 (8 pgs).

Office Action for U.S. Appl. No. 10/971,829, mailed Aug. 14, 2006 (8 pgs).

Office Action for U.S. Appl. No. 10/974,139, mailed Mar. 9, 2006 (10 pgs).

Office Action for U.S. Appl. No. 10/974,139, mailed Apr. 17, 2007 (12 pgs).

Office Action for U.S. Appl. No. 10/976,425, mailed Mar. 26, 2007 (7 pgs).

Office Action for U.S. Appl. No. 11/172,544, mailed Apr. 19, 2007 (10 pgs).

PCT International Search Report dated Nov. 4, 2005, PCT/US2005/022356, filed Jun. 23, 2005.

Article on the web on Answers.com about different ceramic material from Wikipedia <http://www.answers.com/topic/ceramics?cat=technology> (7 pages).

Imanaka, Yoshihiko et al., "Decoupling Capacitor with Low Inductance for High-Frequency Digital Applications," FUJITSU Sci. Tech. J., 38, 1, Jun. 2002, pp. 22-30.

Nagata, Hirotoshi et al., "Improvement of Bonding Strength Between Au/Ti and $SiO_2$ Films by Si Layer Insertion," J. Vac. Sci. Technol. A 17(3), May/Jun. 1999, pp. 1018-1023.

Ohly, C. et al., "Defects in Alkaline Earth Titanate Thin Films—the Conduction Behavior of Doped BST," Integrated Ferroelectrics, 2001, 38, pp. 229-237.

Ohly, C. et al., "Electrical Conductivity and Segregation Effects of Doped SrTiO3 Thin Films," Journal of the European Ceramic Society, 2001, 21(10-11), pp. 1673-1676.

Ohly, C. et al., "High Temperature Conductivity Behavior of Doped $SrTiO_3$ Thin Films," Integrated Ferroelectrics, 2001, 33, pp. 362-372.

Voisard, Cyril et al., "Electrical Conductivity of Strontium Bismuth Titanate under Controlled Oxygen Partial Pressure," Journal of the European Ceramic Society, 19, 1999, pp. 1251-1254.

Yoo, Han-Ill et al., "Defect Structure and Chemical Diffusion in BaTiO3," Solid State Ionics 135, 2000, pp. 619-623.

Office Action for 11/096,315, mailed Jan. 25, 2008 (24 pp).

* cited by examiner

US 7,375,412 B1

ITFC WITH OPTIMIZED C(T)

FIELD

Circuit structures and passive devices.

BACKGROUND

It is desirable to provide decoupling capacitance in a close proximity to an integrated circuit chip or die. The need for such capacitance increases as the switching speed and current requirements of chips or dies becomes higher. Thus, the need for a high number of passive components for high density integrated circuit chips or dies, the resultant increasing circuit density of printed wiring boards (PWB), and a trend to higher frequencies in the multi-gigaHertz range are among the factors combining to increase pressure on passive components surface-mounted on package substrates or PWBs. By incorporating embedded passive components (e.g., capacitors, resistors, inductors) into the package substrate or PWB, improved performance, better reliability, smaller footprint, and lower cost can be achieved.

Capacitors are the predominant passive component in most circuit designs. Typical materials for suitable embedded capacitor components, such as polymer and high-dielectric constant (high-k) ceramic powder composites or high-k ceramic powder and glass powder mixtures, are generally limited to a capacitance density on the order of nanoFarad/cm$^2$ and 0.1 microFarad/cm$^2$.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
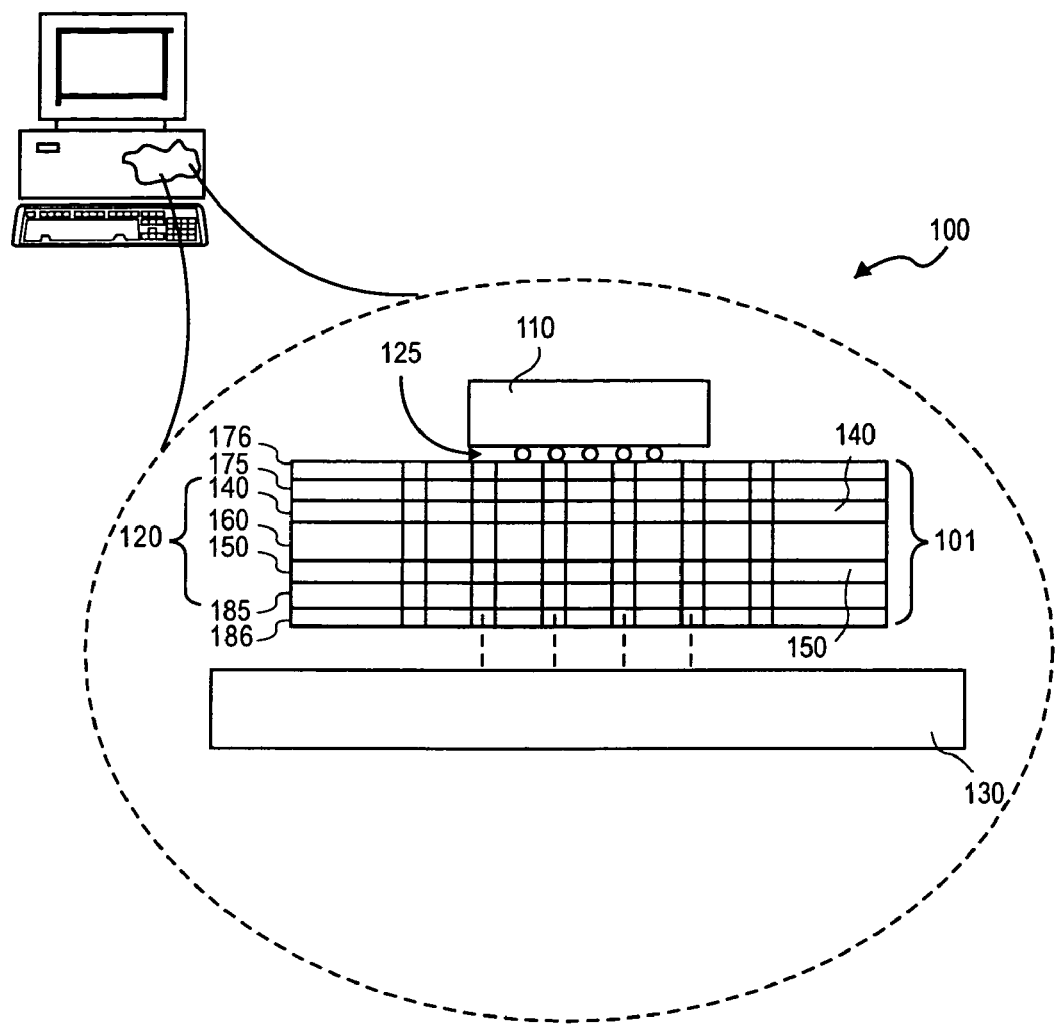
FIG. 1 shows a cross-sectional schematic side view of an embodiment of a chip or die package suitable for mounting on a printed circuit or wiring board.

FIG. 1 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanner, monitors, etc.), entertainment device (e.g., television, radio, stereo, tape and compact disc player, videocassette recorder, MP3 (Motion Picture Experts Group, Audio Layer 3) player, etc.), and the like. FIG. 1 illustrates the package as part of a desktop computer.

FIG. 1 shows electronic assembly 100 including die 110 physically and electrically connected to package substrate 101. Die 110 is an integrated circuit die, such as a processor die. Electrical contact points (e.g., contact pads on a surface of die 110) are connected to package substrate 101 through conductive bump layer 125. Package substrate 101 may be used to connect electronic assembly 100 to printed circuit board 130, such as a motherboard or other circuit board.

In one embodiment, package substrate 101 includes one or more capacitor structures. Referring to FIG. 1, package substrate 101 includes capacitor structure 140 and capacitor structure 150 embedded therein. Capacitor structure 140 and capacitor structure 150 are connected to opposite sides of core substrate 160. In another embodiment, capacitor structure 140 and capacitor 150 may be stacked one on top of the other.

In one embodiment, core substrate 160 is an organic core such as an epoxy including a fiberglass reinforced material, also called pre-preg. This configuration may be referred to as an integrated thin film capacitor (iTFC) system, where the capacitor(s) is(are) integrated into the package substrate rather than, for example, an interposer between the die and the package substrate. Overlying capacitor structure 140 is adhesion layer 175 (e.g., silica-filled epoxy). Underlying capacitor structure 150 is adhesion layer 185. Overlying adhesion layer 175 is build-up layer 176. Underlying adhesion layer 185 is build-up layer 186. Adhesion layer 175 and adhesion layer 185 act as adhesion layers to the overlying and underlying build-up layers 176 and 186, respectively. Each build-up layer includes traces (e.g., copper traces) for lateral translation of contact points between die 110 and package substrate 101, and package substrate 101 and printed circuit board 130, respectively and typically solder resist as a top layer. The region made up of the combination of layers, 185, 150, 160, 140 and 175, is referred to herein as functional core 120.

Figure 2:
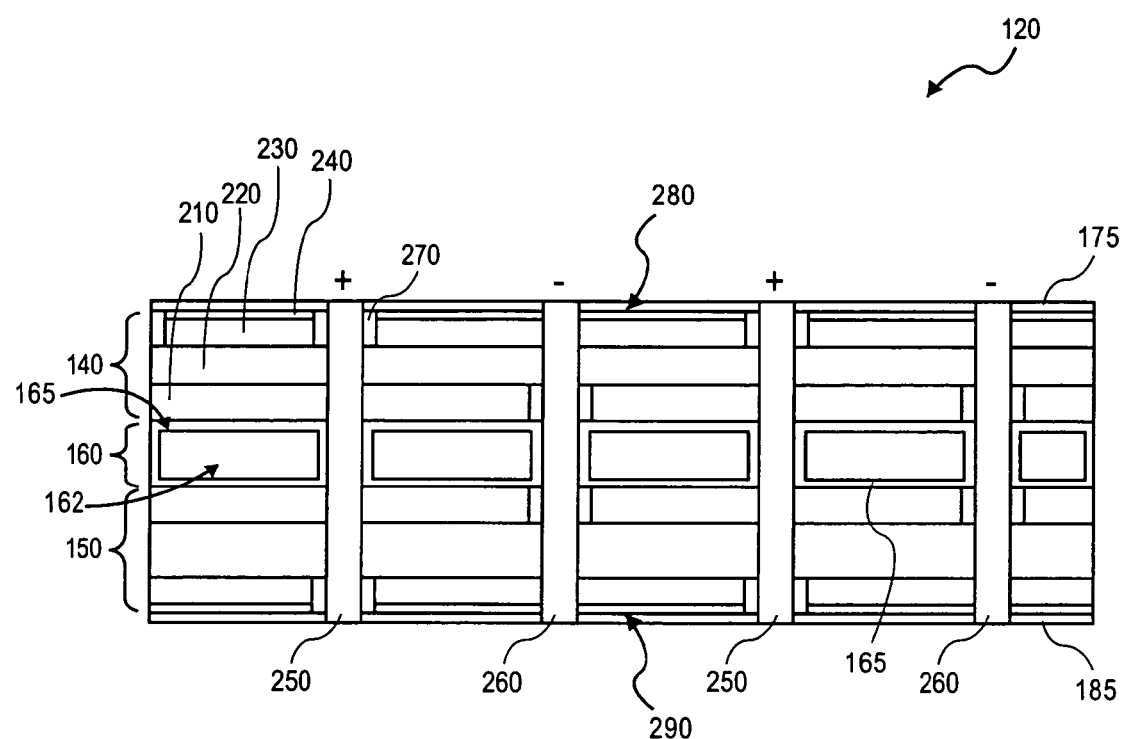
FIG. 2 shows a cross-sectional schematic side view of the package substrate of FIG. 1.

FIG. 2 shows a magnified view of a portion of functional core 120. Functional core 120 includes core substrate 160 having a thickness, in one embodiment, on the order of 200 microns (μm) to 700 μm. In another embodiment, core substrate 160 has a thickness on the order of 200 μm to 300 μm. In one embodiment, core substrate 160 includes core 162, such as a glass-fiber reinforced epoxy, and shell 165, such as a silica-particle filled epoxy.

Capacitor structure 140 is connected to one side of core substrate 160 (a top side as viewed). Capacitor structure 140 includes first conductor 210 proximal to core substrate 160 and second conductor 230. Disposed between first conductor 210 and second conductor 230 is dielectric material 220. Capacitor structure 150 is connected to an opposite side of core substrate 160 (a bottom side as viewed) and has a similar configuration of a dielectric material disposed between two conductors. Overlying capacitor structure 140 and capacitor structure 150 of functional core 120 (on sides opposite sides facing core substrate 160) is adhesion layer 175 and adhesion layer 185, respectively, made of, for example, an organic material and having a representative thickness on the order of 10 microns (μm) to 50 μm. Build-up layer 176 and build-up layer 186 of FIG. 1 would be deposited on these adhesion layers. As noted above, the build-up layers may include traces and contact points to connect package substrate to a chip or die and to a printed circuit board, respectively, and solder resist as a top layer.

In one embodiment, first conductor 210 and second conductor 230 of capacitor structure 140 are electrically conductive material. Suitable materials include, but are not limited to, a nickel or a copper material. In one embodiment, dielectric material 220 is a ceramic material having a relatively high dielectric constant (high-k). Suitable materials for dielectric material 220 include, but are not limited to, barium titanate ($BaTiO_3$), barium strontium titanate ($(Ba,Sr)TiO_3$), and strontium titanate ($SrTiO_3$).

In one embodiment, capacitor structure 140 includes first conductor 210 and second conductor 220 having a thickness on the order of 20 μm to 50 μm, and dielectric material 220 of a high-k ceramic material of a thickness on the order of 1 μm to 3 μm and, in another embodiment, less than 1 μm. Capacitor structure 150, in one embodiment, is similar to capacitor structure 140.

In the embodiment of functional core 120 shown in FIG. 2, capacitor structure 140 includes overlayer 240 on second conductor 230. Overlayer 240 is an optional electrically conductive layer that may be used in an instance where second conductor 230 is a material that may not be compatible or may be less compatible with materials or processing operations to which functional core 120 may be exposed. For example, in one embodiment, second conductor 230 is a nickel material. To render functional core 120 transparent to subsequent processing operations or compatible with materials to which functional core 120 may be exposed, overlayer 240 is a copper material. Representatively, overlayer 240, if present, may have a thickness on the order of a few microns.

FIG. 2 shows a number of conductive vias extending through functional core 120 between surface 280 and surface 290. Representatively, conductive via 250 and conductive via 260 are electrically conductive materials (e.g., copper or silver) of suitable polarity to be connected to power or ground contact points of die 110 (e.g., through conductive bump layer 125 to contact pads on die 110 of FIG. 1). In this manner, conductive via 250 and conductive via 260 extend through capacitor structure 140, core substrate 160, and capacitor structure 150. Conductive vias 250 and 260 may be insulated, where desired, from portions of capacitor structure 140 or capacitor structure 150 by sleeves 270 of a dielectric material.

Figure 3:
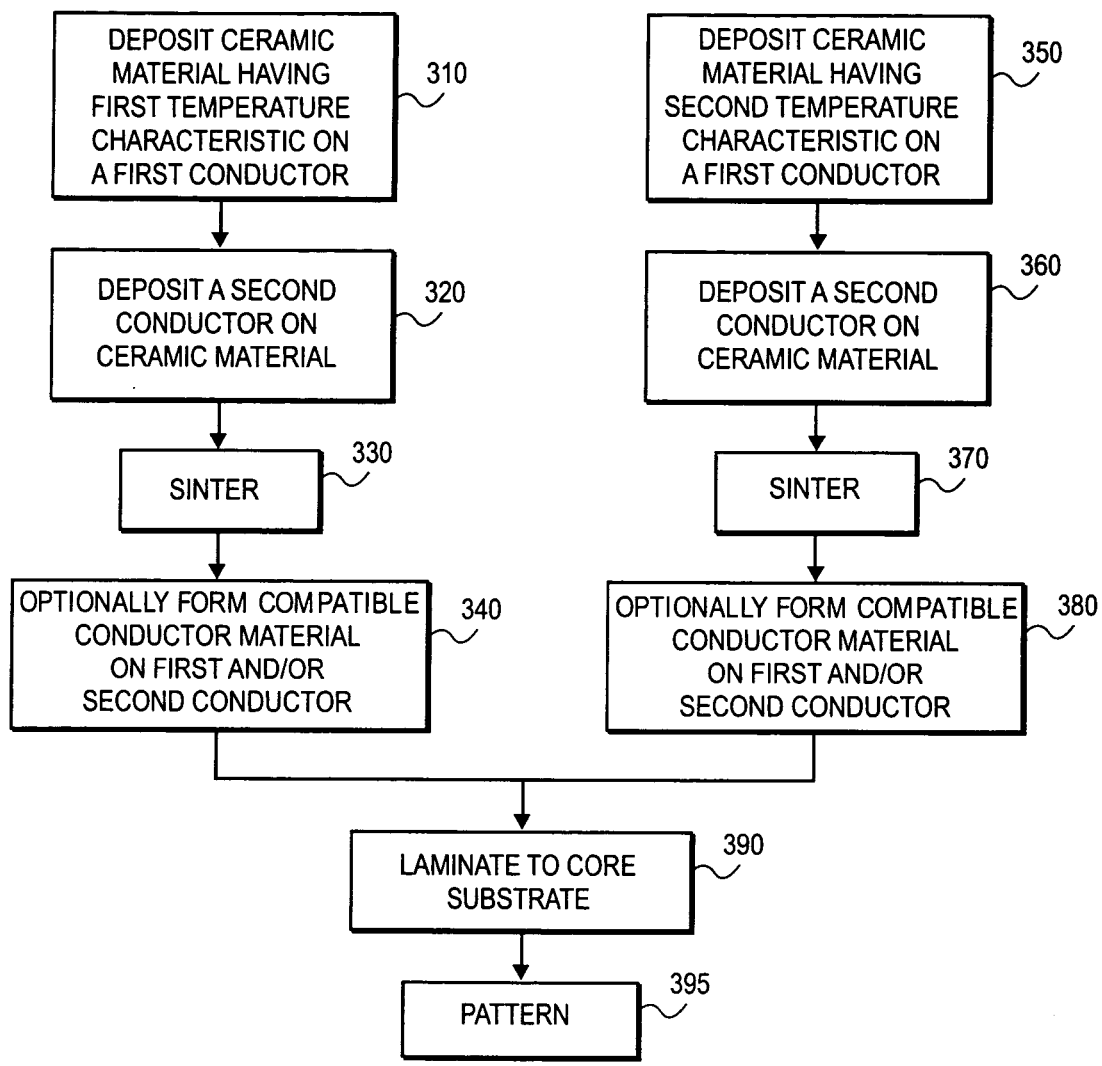
FIG. 3 describes a process flow for forming a capacitor.

FIG. 3 presents a process for forming a portion of a package substrate including a core substrate such as core substrate 160 and capacitor structures, such as capacitor structure 140 and capacitor structure 150, on opposite sides of the core substrate. Specifically, FIG. 3 presents a process for forming a portion of a package substrate having capacitors with different ceramic material, selected, in one embodiment, based on the temperature characteristic of the ceramic material. A capacitor structure, such as capacitor structure 140 and/or capacitor structure 150 may be formed and then separately connected to core substrate 160. FIGS. 4-9 show formation processes in connection with portions of the process flow described in FIG. 3.

In one embodiment, ceramic formulations for use in a capacitor structure have a generally stable temperature characteristic. Temperature characteristics are designated by the Electronics Industries Association (EIA). For class II and class III dielectrics (including X7R, X5R, ZFU and Y5V), the first symbol indicates the lower limit of the operating temperature range, the second indicates the upper limit of the operating temperature range, and the third indicates the maximum capacitance change allowed over the operating temperature range. EIA type designation codes for class II and class III dielectrics are shown in Table 1.

TABLE 1

EIA Temperature Characteristic Codes for Class II & III Dielectrics

| Low Temperature Rating | | High Temperature Rating | | Maximum Capacitance Shift | | |
|---|---|---|---|---|---|---|
| Degree Celsius | Letter Symbol | Degree Celsius | Number Symbol | Percent | Letter Symbol | EIA Class |
| +10 C. | Z | +45 C. | 2 | ±1.0% | A | II |
| −30 C. | Y | +65 C. | 4 | ±1.5% | B | II |
| −55 C. | X | +85 C. | 5 | ±2.2% | C | II |
|  |  | +105 C. | 6 | ±3.3% | D | II |
|  |  | +125 C. | 7 | ±4.7% | E | II |
|  |  | +150 C. | 8 | ±7.5% | F | II |
|  |  | +200 C. | 9 | ±10.0% | P | II |
|  |  |  |  | ±15.0% | R | II |
|  |  |  |  | ±22.0% | S | III |
|  |  |  |  | ±22/−33% | T | III |
|  |  |  |  | ±22/−56% | U | III |
|  |  |  |  | ±22/−82% | V | III |

Figure 4:
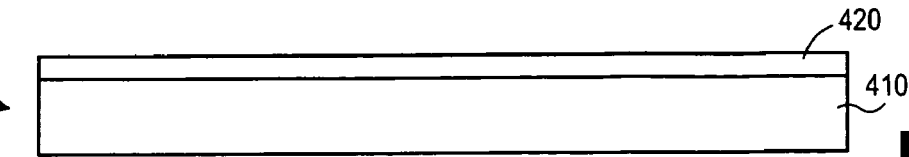
FIG. 4 shows a schematic side view of a first conductor sheet having a dielectric material having a first temperature characteristic deposited thereon.

FIG. 4 shows structure 425 of a first conductor 410 of, for example, a nickel sheet or foil possibly having a layer of nickel paste on a surface of first conductor 410 (a top surface as viewed). In one embodiment, a nickel paste will have ceramic powder (e.g., barium titanate) additions in order to provide an adhesion layer between the underlying nickel foil and the soon-to-be-deposited overlying X7R (or X7S or any other temperature appropriate for the application) ceramic green sheet. In one embodiment, a first conductor 410 will be made of Ni green sheet, which will have ceramic powder (e.g., barium titanate) additions in order to provide an adhesion to the soon-to-be-deposited overlying X7R (or X7S or any other temperature appropriate for the application) ceramic green sheet.

FIG. 4 shows structure 425 of ceramic layer 420 of an X7R (or X7S or any other temperature appropriate for the application) ceramic green sheet deposited on first conductor 410 (block 310). Ceramic layer 420 or green sheet, in one embodiment, is laminated on an underlying nickel paste layer. In one embodiment, a X7R dielectric is selected having an operating temperature range of −55° C. to +125° C. rating and a dielectric constant, k, on the order of 3,000. This material may be selected because it has a generally stable temperature characteristic ($C_{room\ temperature} \pm 10\text{-}15\%$). One reason for the selection of a X7R dielectric is that the capacitor structure being formed will be positioned on a die side of a package substrate where the capacitor structure may be exposed to high temperatures (e.g., greater than 100° C.).

Figure 5:
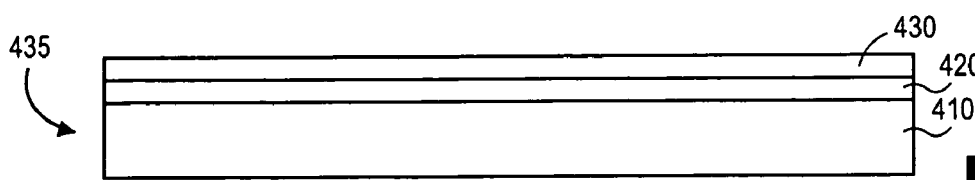
FIG. 5 shows the structure of FIG. 4 following the formation of a second conductor on the dielectric layer opposite the first conductor.

Referring to FIG. 3, following the deposition of a ceramic material, a second conductor is deposited on the ceramic material (block 320). FIG. 5 shows structure 435 similar to structure 425 in FIG. 4, including second conductor (e.g., a nickel sheet or foil) 430 having, for example, a layer of nickel past formed thereon. Nickel foil 430 is laminated on top (as viewed) of structure 425 in order to form structure 435 in FIG. 5. In one embodiment, a first conductor 410 will be made of Ni green sheet, which will have ceramic powder (e.g., barium titanate) additions in order to provide an adhesion to the underlying X7R (or X7S or any other temperature appropriate for the application) ceramic green sheet. In one embodiment, following lamination, structure 435 is thermally treated to burn-off organic contents. Representatively, a thermal treatment would involve a temperature range of 300 to 500° C. for a duration of between two hours and a day.

Referring again to FIG. 3, following the formation of a dielectric material between conductor materials, the composite structure is subsequently heat-treated in a reducing atmosphere in order to density (e.g., reduce the surface energy of) the green sheet and nickel paste layers simultaneously (block 330). Once the heat treatment is completed, the product will have sufficient strength for packaging and handling purposes, and will have a sufficiently dense microstructure.

Figure 6:
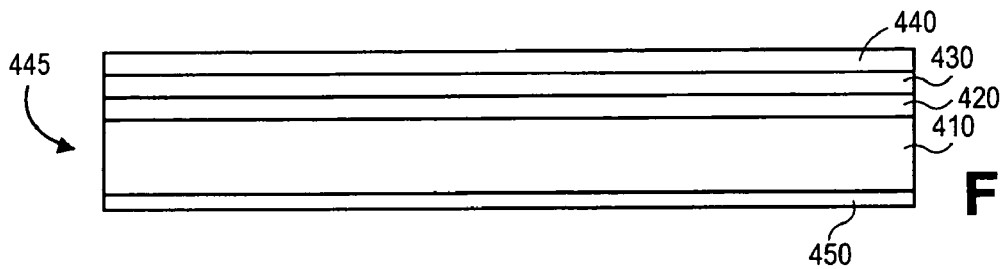
FIG. 6 shows the structure of FIG. 5 following the formation of a different conductive material on exposed surfaces of the first conductor and second conductor.

Following heat treatment, the method of FIG. 3 provides, as an optional operation, that one or both of an exposed surface of the first conductor and the second conductor are coated with a different electrically conductive material (block 340). FIG. 6 shows structure 445 where two copper layers have been deposited on top and bottom surfaces of structure 445, respectively. Copper layer 440 and copper layer 450 are deposited, in one embodiment, through electroless deposition followed by subsequent depositions on respective surfaces of copper by electroplating to form copper layer 440 and copper layer 450. Copper layer 440 and copper layer 450 may have a thickness on the order of a few microns. Alternatively, a copper layer may be formed by depositing a copper paste including copper particles and sintering the paste.

Copper coating may be desirable to make the capacitor structure transparent to subsequent processing operations to which the capacitor structure or a package substrate may be exposed. In the example where first conductor 410 and second conductor 430 are a nickel material, for example, it may be desirable to coat and exposed surface of the first or second conductor with a copper material.

Referring again to FIG. 3, at the same time, before or after the formation of structure 445 (e.g., a capacitor structure), a second capacitor structure may be formed. The second capacitor structure would be used in the formation of the same package substrate. The second capacitor structure, however, may use a dielectric material (e.g., a ceramic material) having a less stable temperature characteristic than the dielectric material used in the formation of structure 445. In one embodiment, a dielectric material has a less stable temperature characteristic and a higher dielectric constant. Referring to Table 1, in one embodiment, a suitable dielectric material is a Y5V dielectric having a temperature rating of −25° C. to +80° C. and a dielectric constant on the order of about 20,000. Representatively, a capacitor structure formed with a Y5V dielectric material may be placed opposite the die side of a package substrate.

Figure 7:
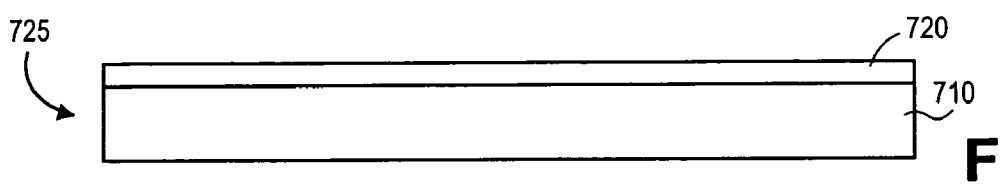
FIG. 7 shows a schematic side view of a first conductor sheet having a dielectric material having a second temperature characteristic deposited thereon.

In one embodiment of forming a capacitor structure, the processing operations described with reference blocks 310-340 may be followed. A sheet (e.g., foil) of a first conductor material having a representative thickness on the order of several microns to tens of micron, is provided as an initial substrate. A ceramic material may be deposited to a thickness on the order of one micron or less onto the first conductor (block 350). FIG. 7 shows structure 725 made up of first conductor 710, for example, of a nickel sheet or foil possibly having a layer of nickel paste on a surface of first conductor 710 (a top surface as viewed). In one embodiment, a nickel paste layer will have ceramic powder (e.g., barium titanate) additions in order to provide an adhesion layer between the underlying nickel foil and the soon-to-be-deposited overlying Y5V green sheet. In one embodiment, a first conductor 710 will be made of Ni green sheet, which will have ceramic powder (e.g., barium titanate) additions in order to provide an adhesion to the soon-to-be-deposited overlying Y5V ceramic green sheet.

FIG. 7 shows structure 425 with ceramic layer 720 of a Y5V green sheet deposited on first conductor 710. Ceramic layer 720 or green sheet, in one embodiment, is laminated on an underlying nickel paste layer.

Figure 8:
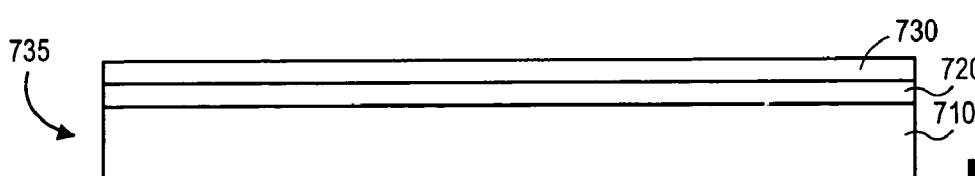
FIG. 8 shows the structure of FIG. 7 following the formation of a second conductor on the dielectric layer opposite the first conductor.

Referring again to FIG. 3, following the deposition of ceramic material on a first conductor, a second conductor is deposited (block 360). FIG. 8 shows structure 735 similar to structure 725 of FIG. 4 having a nickel paste-nickel foil second conductor 730 laminated on top (as viewed) of structure 725 in order to form structure 735 in FIG. 8. In one embodiment, following lamination, structure 735 is thermally treated to burn-off organic contents. Representatively, a thermal treatment would involve a temperature range of 300 to 500° C. for a duration of between two hours and a day.

Figure 9:
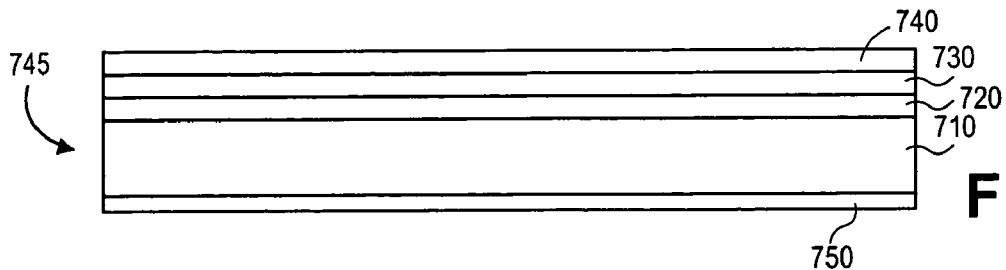
FIG. 9 shows the structure of FIG. 8 following the formation of a different conductive material on exposed surfaces of the first conductor and second conductor.

Referring again to FIG. 3, following the formation of a dielectric material between conductor materials, the composite structure (structure 735) is subsequently heat-treated in a reducing atmosphere in order to densify the ceramic green sheet and optional nickel paste layers simultaneously (block 370). Following heat treatment, the method of FIG. 3 provides, as an optional operation, that one or both of first conductor 710 and second conductor 730 are coated with a different electrically conductive material (block 380). FIG. 9 shows structure 745 having copper layer 740 and copper layer 750 deposited on top and bottom surfaces of the structure 745, respectively. Copper layer 740 and copper layer 750 may be deposited, in one embodiment, through electroless deposition followed by electroplating through a thickness on the order of a few microns.

Referring to the method of FIG. 3, capacitor structure 445 (FIG. 6) and capacitor structure 745 (FIG. 9) may be attached to a core substrate, such as an organic core substrate as discussed above (block 390). In the example where a copper layer overlays a conductor, the copper surface may need to be roughened (e.g., by etching) in order to enhance lamination. Even in the case where there is no overlaying copper layer, the conductor surfaces may need to be roughened (e.g., by etching) in order to enhance lamination.

Figure 10:
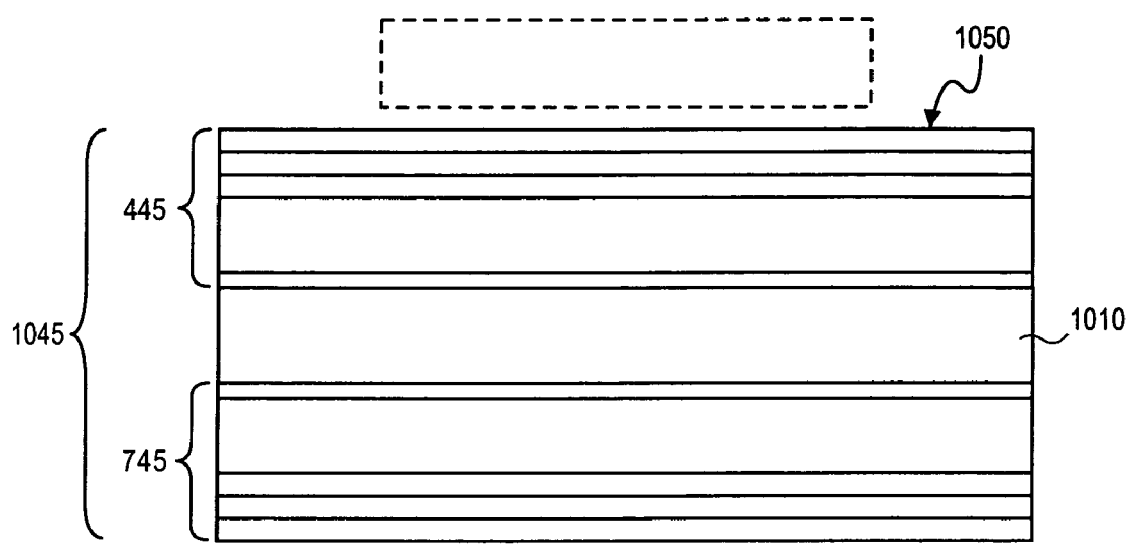
FIG. 10 shows a cross-sectional schematic side view of a package substrate including a core substrate with a structure of FIG. 6 and the structure of FIG. 7 connected to opposite sides thereof.

FIG. 10 shows structure 1045 including core substrate 1010 having structure 445 (capacitor structure) and structure 745 (capacitor structure) laminated to opposite sides of core structure 1010. Following laminating of the capacitor structures to a core substrate to form package substrate 1045, the package substrate may be patterned (block 360, FIG. 3). Conventional patterning operations, such as mechanical drilling, drilling via holes in epoxy with laser, lithography and copper plating operations used in via formation may be employed. Each capacitor structure may also be patterned to form individual capacitors. A complete package substrate may further include build-up layers of an organic material (e.g., epoxy or glass particle-filled epoxy) onto the substrate.

Referring to the orientation shown in FIG. 10, the package substrate is provided with structure 445 having a ceramic material with a more stable temperature characteristic on a die side of the package substrate. FIG. 10 shows package substrate 1045 having die side 1050. In one embodiment, structure 445 of a capacitor including an X7R ceramic material is formed on die side 1050. The X7R should provide a flat temperature response with respect to the dielectric constant at room temperature. Because of its temperature stability, the capacitor should provide sufficient charge at a relatively low loop inductance, relative to the capacitor structure 745, making it suitable for first droop uses. However, the dielectric constant, k, of structure 445 may not be as high as desired. The capacitor of structure 745, alternatively, is selected, in one embodiment, to provide high capacitance at lower temperature, since the lower portion of the substrate would be running colder than the top portion which is closer to the heat generating silicon die. In this case, structure 745 is suitable for second droop operation where high inductance is not as critical. Because structure 745 utilizes a ceramic material with a relatively high dielectric constant, the overall capacitance of the package substrate (structure 445 plus structure 745) is high.

In the above embodiment, package substrate 1045 included a single capacitor structure on opposing sides of the package. In another embodiment, multiple capacitor structures may be placed on one or more sides, such as placing multiple capacitor structures using a dielectric material having a stable temperature characteristic (e.g., $C_{room\ temperature} \pm 10\text{-}15\%$) on die side 1050 of the package substrate.

Figure 11:
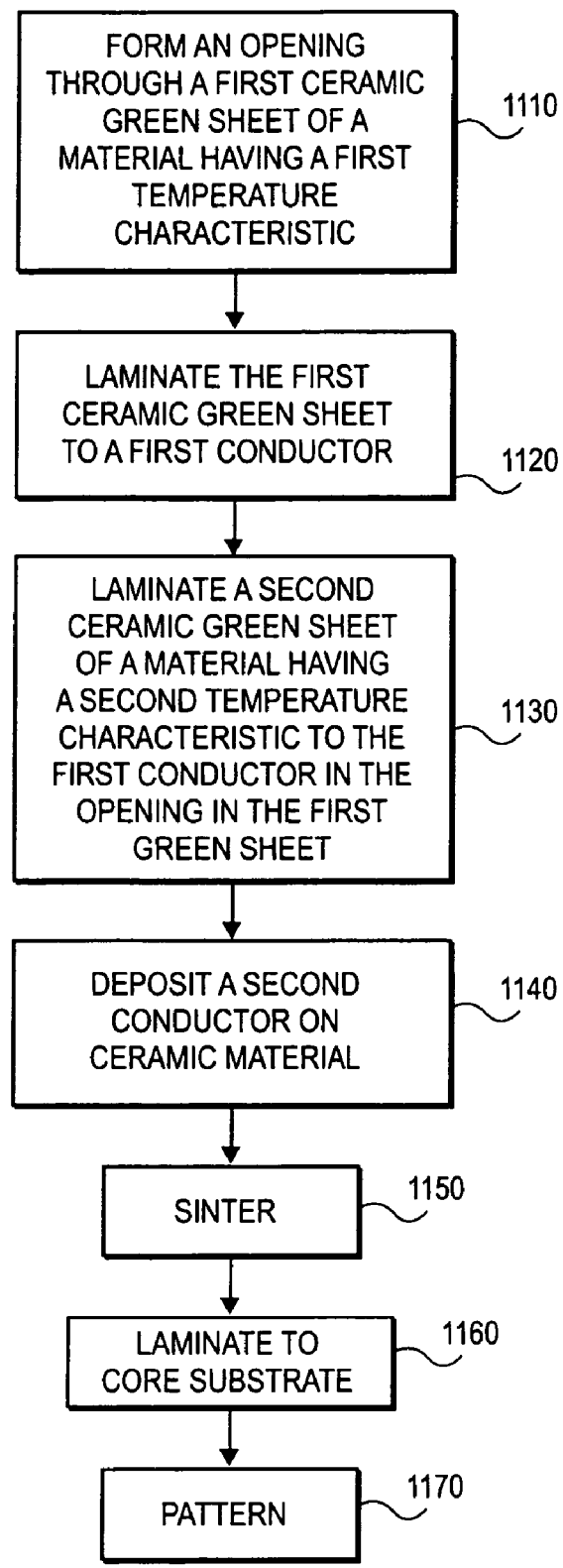
FIG. 11 describes a second process flow performing a capacitor.

FIG. 11 presents a second process of forming a package substrate, such as package substrate 120. This process describes in particular the formation of capacitor structure 140 on a die side of package substrate 120. FIGS. 12-17 show formation processes in connection with portion of the process flow described in FIG. 11, notably in the embodiment of forming a capacitor structure.

Figure 12:
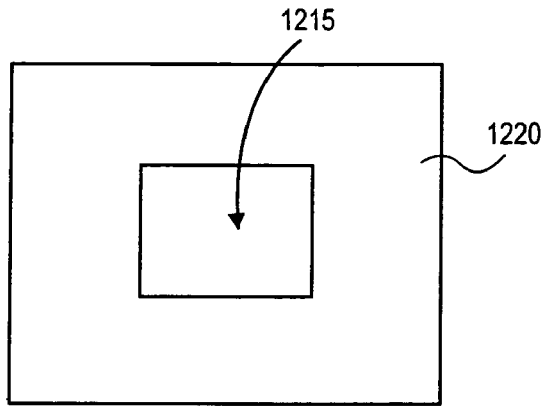
FIG. 12 shows a schematic top view of a ceramic green sheet having an opening formed therein.

Referring to FIG. 11, in one embodiment of forming a capacitor structure of a package substrate, a green sheet of a ceramic material is provided and an opening is made through the ceramic green sheet in an area corresponding to an area predicted to be under the die shadow of a package (block 1110). In one embodiment, a ceramic green sheet may be selected of a material that has a generally lower steady state operating temperature and a high dielectric constant. Referring to Table 1, a suitable material for the ceramic green sheet is a ceramic classified as Y5V, having a temperature rating of −25° C. to +80° C. and a dielectric constant on the order of 20,000. The lower steady state operating temperature of the material makes such material suitable for capacitance applications outside the die shadow where the temperature conditions generally will not exceed the temperature rating. FIG. 12 shows ceramic layer or green sheet 1220 having a rectangular form with rectangular opening 1215 formed therein. Opening 1215 is selected to be of a size, in one embodiment, such that an exposure of a material for ceramic layer 1220 to temperatures outside its maximum operating temperature range is minimized. In one embodiment, opening 1215 is formed in a portion of layer 1220 corresponding with a projected die shadow of a package. One way to form opening 1215 in ceramic layer 1220 is through mechanical punching, laser or lithographic etching.

Figure 13:
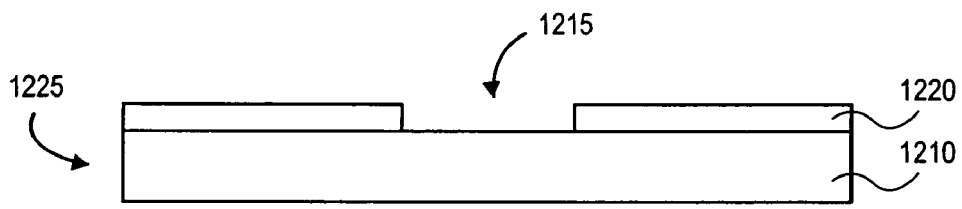
FIG. 13 shows a cross-sectional schematic side view of a first conductor having the ceramic green sheet of FIG. 12 connected to one side thereof.

Referring to FIG. 11, following the formation of an opening through a ceramic green sheet of a material having a first temperature characteristic, the green sheet is laminated to a first conductor (block 1120). In one embodiment, the substrate is a sheet (e.g., foil) of a first conductor material having a representative thickness on the order of several microns to tens of microns is provided. FIG. 13 shows structure 1225 made up of first conductor 1210 of, for example, a nickel green sheet, or a nickel sheet of foil possibly having a layer of nickel paste on a surface of first conductor 1210 (a top surface as viewed). In one embodiment, a nickel paste layer will have ceramic powder (e.g., barium titanate) additions in order to provide an adhesion layer between the underlying nickel foil and the soon-to-be-deposited overlying Y5V green sheet. In one embodiment, a first conductor 710 will be made of Ni green sheet, which will have ceramic powder (e.g., barium titanate) additions in order to provide an adhesion to the soon-to-be-deposited overlying Y5V ceramic green sheet. FIG. 13 shows structure 1225 with ceramic layer 1220 of a Y5V green sheet deposited on first conductor 1210. FIG. 13 is a cross sectional side view through structure 1225 to illustrate opening 1215 in ceramic layer 1220.

Referring to FIG. 11, following the lamination of ceramic layer 1220 on first conductor 1210, a second ceramic material is laminated to the first conductor in the opening in the first ceramic layer (block 1130). The second ceramic material may be selected of a material having a higher temperature rating (e.g., a stable temperature characteristic ($C_{room\ temperature} \pm 10\text{-}15\%$)) suitable for use with temperature conditions typically experienced under a die shadow. Referring to Table 1, one suitable ceramic material is an X7R dielectric having a temperature range of −55° C. to 125° C. and a dielectric constant on the order of about 3,000. The ceramic material with the high temperature rating may be patterned to fit within opening 1215 (see FIG. 12 or FIG. 13) through mechanical punching, laser or lithographic etching.

Figure 14:
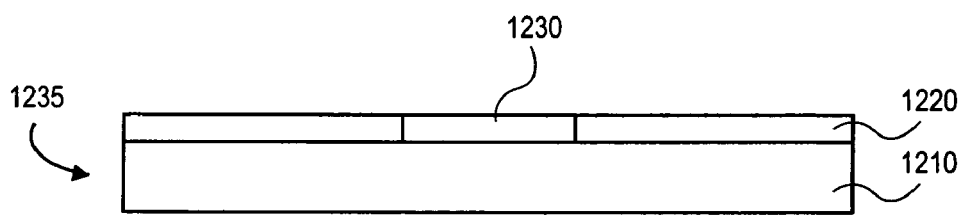
FIG. 14 shows the structure of FIG. 13 following the introduction of a second ceramic material in the opening formed in the first ceramic material.
Figure 15:
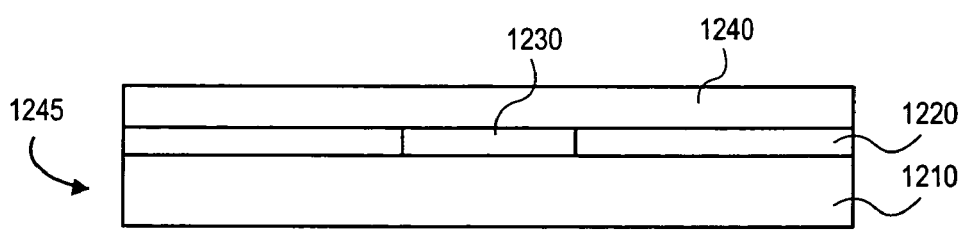
FIG. 15 shows the structure of FIG. 14 following the connection of a second conductor to the dielectric layer (composite ceramic materials) opposite the first conductor.

FIG. 14 shows structure 1235 including first conductor 1210 and ceramic layer 1220. Structure 1235 also includes ceramic layer segment 1230 laminated to first conductor 1210 in opening 1215 (see FIG. 13) of a ceramic material having a relatively high temperature rating. In one embodiment, following lamination, a second conductor is deposited on structure 1235 on the composite dielectric layer (block 1140). FIG. 15 shows structure 1245 including second conductor (e.g., a nickel sheet or foil or nickel green sheet) 1240 laminated (possibly with a nickel paste between the conductor and the ceramic material) to dielectric layer 1220 and dielectric layer 1230. In one embodiment, following lamination, structure 1245 is thermally treated to burn-off organic contents. Representatively, a thermal treatment would involve a temperature range of 300 to 500° C. for a duration of between two hours and a day.

Referring again to FIG. 11, following the formation of a composite dielectric material between conductor materials, the structure is subsequently heat-treated in a reducing atmosphere in order to densify the dielectric and nickel paste layers simultaneously (block 1150).

Figure 16:
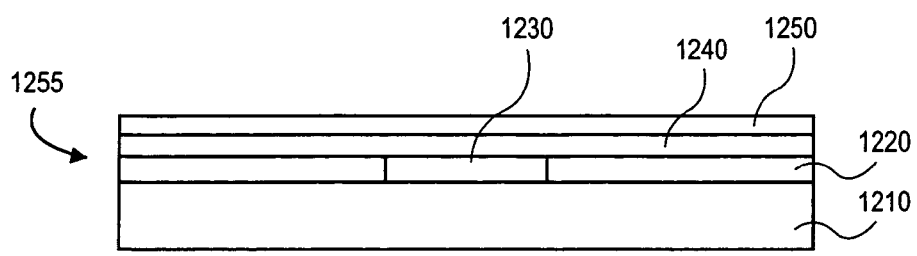
FIG. 16 shows the structure of FIG. 15 following the introduction of a different conductive material on exposed surfaces of the first conductor and the second conductor.
Figure 17:
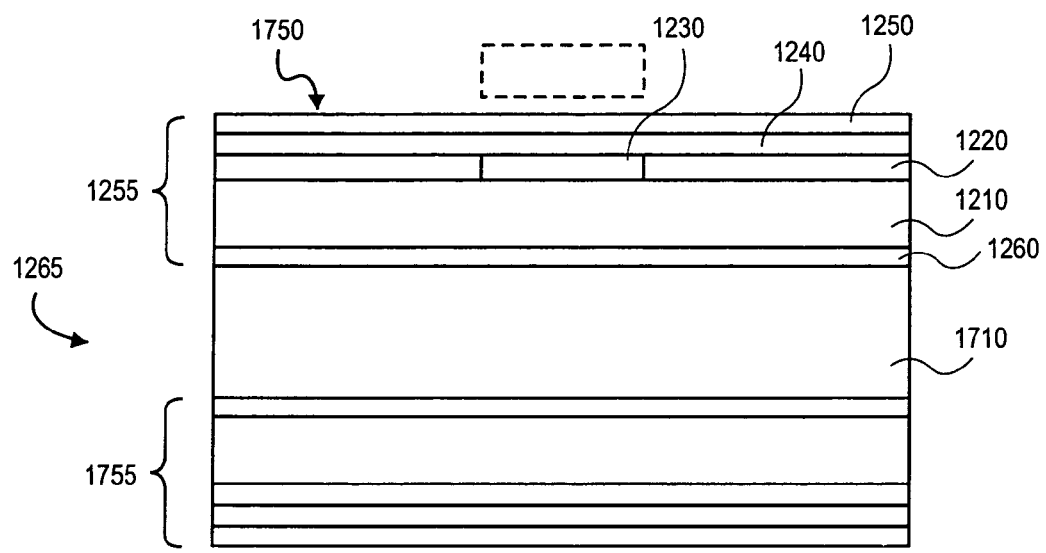
FIG. 17 shows a package substrate including a core and the structure of FIG. 16 coupled to a die side of the core.

FIG. 16 shows structure 1255 following the optional coating of first conductor 1210 and second conductor 1240 with a different electrically conductive material. In the example where first conductor 1210 and second conductor 1240 are a nickel material, the nickel material may be coated with a copper material. FIG. 17 shows copper layer 1250 overlying second conductor 1240 and copper layer 1260 underlying first conductor 1210. Copper layer 1250 and copper layer 1260 may be deposited, for example, using a combination of electroless and electroplating techniques or by depositing a copper paste including copper particles and sintering the paste.

Referring again to FIG. 11, the capacitor structure (structure 1255 of FIG. 16), may be attached to a core substrate, such as an organic core substrate as discussed above (block 1160). In the example where a copper layer overlays a conductor, the copper surface may need to be roughened in order to enhance lamination. Even in the case where there is no overlaying copper layer, the conductor surfaces may need to be roughened (e.g., by etching) in order to enhance lamination. The capacitor structure may be attached to one surface of a base substrate. FIG. 17 shows structure 1255 coupled to core substrate 1710. Structure 1255 is coupled to die side 1750 of core substrate 1710. A second capacitor structure (capacitor structure 1755) may be connected to an opposite side of core substrate 1710. The package substrate could then be patterned according to techniques such as described above with reference to block 395 of FIG. 3 (block 1170).

As shown in FIG. 17, dielectric layer 1230 having, in one embodiment, a relatively high temperature rating, is positioned so that it includes an area under a projected die shadow. It is appreciated, that the dimensions (length and width) of dielectric layer 1230 may extend beyond projected die shadow or be within a projected die shadow depending, for example, on desired operating conditions and overall capacitance of the package substrate. In an embodiment where a second capacitor structure (structure 1755) is laminated to an opposite side of core substrate 1710, the capacitor structure may be formed with a dielectric material having a generally lower steady state operating temperature (due to its remote location relative to an operating die) and a high capacitance. One suitable dielectric material would be a Y5V material.

Figure 18:
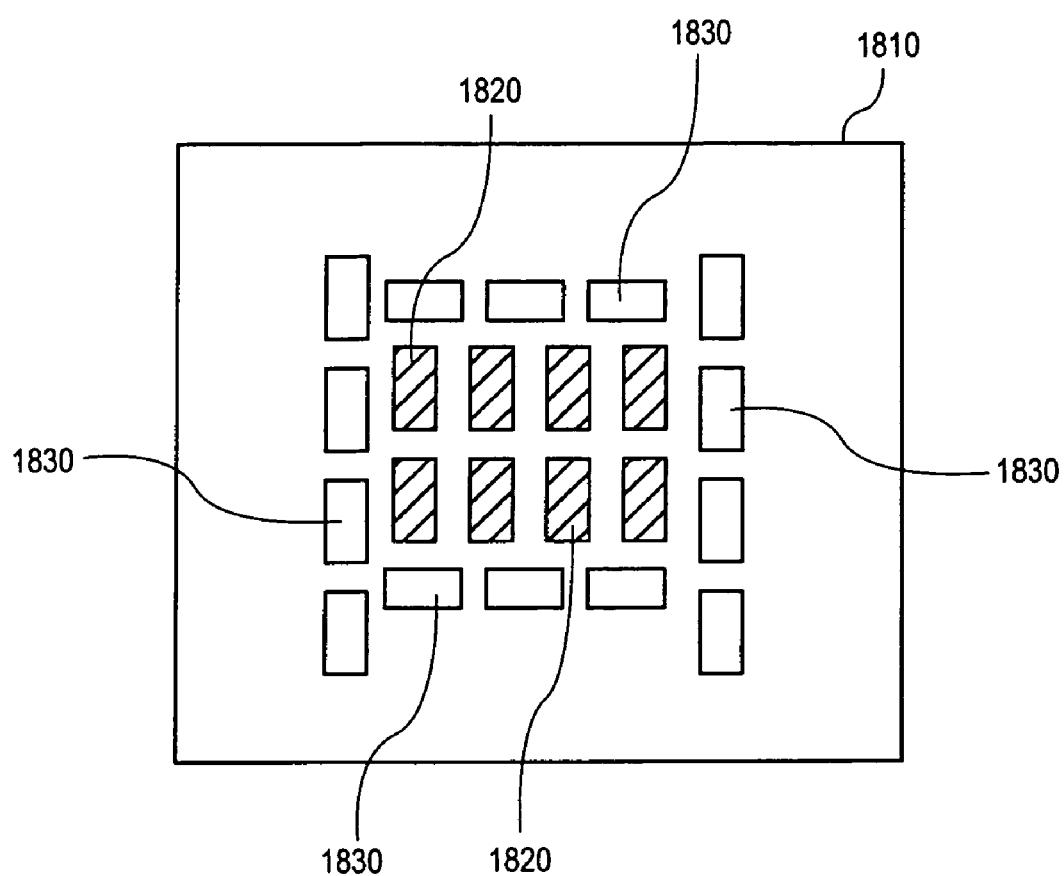
FIG. 18 shows a schematic top view of a package substrate having capacitors formed of dielectric material with different temperature rating.

The embodiment described with reference to FIGS. 11-17 recognizes that in operation, the temperature on a package is not uniform. Thus, in one embodiment of constructing a package, capacitors with a higher temperature rating (typically lower capacitance) are only needed in the hottest spots. In another embodiment, capacitors with different ratings are used at different spots on a package. In this manner, more capacitance can be placed on a package because lower temperature ratings typically lead to a higher average capacitance. Furthermore, capacitors with higher temperature ratings tend to cost more than capacitors with lower temperature rating. Thus, the total cost of power delivery can be brought down with a selection of capacitors with different temperature ratings. FIG. 18 shows one embodiment of a package having two different capacitors, one with a higher temperature rating than the other. Temperature ratings of dielectric materials of capacitor structures may be determined, for example, by the characteristic codes set forth in Table 1 above. In one embodiment, capacitors 1820 of package 1810 use an X7R dielectric material (125° C., ±15 percent) for areas of package 1810 that are predicted to see high temperatures and capacitors 1830 use an X5R dielectric material (85° C., +15 percent) in areas predicted to see a lesser temperature. By using X7R-rated capacitors only in areas predicted to see high temperatures (e.g., under a die shadow) and X5R-rated capacitors in cooler locations, the overall capacitance of package 1810 may be increased.

Figure 19:
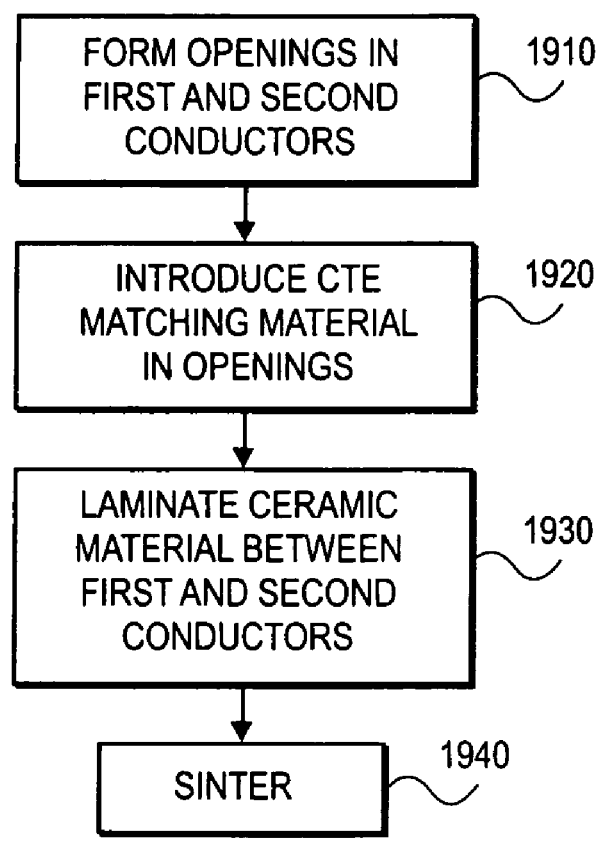
FIG. 19 describes a third process flow performing a capacitor.
Figure 20:
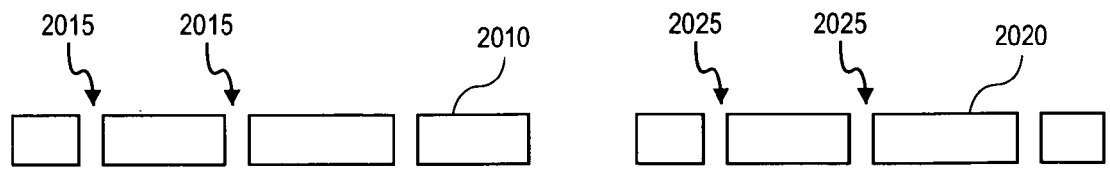
FIG. 20 shows a first conductor and a second conductor each having opening formed through a thickness thereof.
Figure 21:
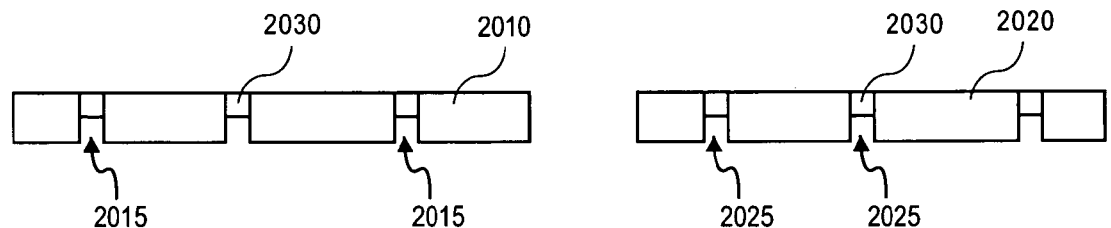
FIG. 21 shows the first conductor and second conductor of FIG. 20 having a coefficient of thermal expansion (CTE)-matching material disposed in the openings.
Figure 22:
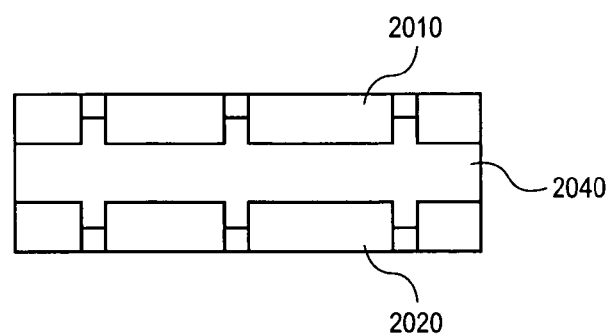
FIG. 22 shows the first conductor and second conductor of FIG. 21 connected to and disposed on opposite sides of a ceramic material.

In the above embodiments, techniques for forming capacitor structures are described where a ceramic material may be laminated to a conductive foil, such as a nickel or copper foil. Representative embodiments also describe the use of a conductive foil as one electrode and a conductive paste as another electrode. One concern with the use of a paste or green sheet for one or both electrodes is that when a capacitor is pressed in a green state, the paste may be extruded through the ceramic material and contact the opposite electrode, resulting in shorting. A problem with using conductive sheets or foils is that the adhesion strength between the ceramic and a conductor are weak and the ceramic may delaminate from the conductive sheet. Attempts have been made to use conductive foils as both the top and bottom electrodes, however, the organic content in the ceramic material cannot out-gas during processing leading to bulging/cracking of the capacitor structures. FIG. 19 describes a process of forming a capacitor structure using conductive sheets. FIGS. 20-22 show formation processes in connection with portions of the process flow described in FIG. 19.

Referring to FIG. 19, in a process of forming a capacitor structure, first and second conductors of conductive sheets or foils are provided and openings are formed through a thickness of the conductive sheets (block 1910). FIG. 20 shows first conductor 2010 and second conductor 2020 suitable for use as conductors of a thin film capacitor. First conductor 2010 and second conductor 2020 are representatively, a nickel or copper sheet (e.g., foil) having a thickness on the order of several microns to tens of microns depending on the particular design parameters. As illustrated, each of first conductor 2010 and second conductor 2020 have a number of holes formed through a thickness of the sheet. FIG. 20 shows first conductor 2010 having openings 2015 extending completely through a thickness of the sheet and first conductor 2020 having openings 2025 completely through a thickness of the sheet. Openings may be formed using laser drilling or etching techniques. In one embodiment, the number of openings are maximized to reduce the stress per linkage (linkage between openings) in the respective sheets. Representative openings on the order of 10-50 micrometers are suitable.

Referring to FIG. 19, following the formation of openings in first and second conductors, the method provides introducing a material in the opening that has a coefficient of thermal expansion (CTE) between a CTE for a material of the conductor and a CTE of a ceramic material that, in this embodiment, will serve as a dielectric of the capacitor (block 1920). In one embodiment, a suitable CTE-matching material for deposition in the openings in the conductor is a metal/ceramic paste having metal particles similar to a material for the conductor and ceramic particles similar to a material for the ceramic material that will be used for the dielectric. In one embodiment, a paste is deposited to partially fill the openings, i.e., partially extend through a thickness of the first or second conductor, respectively. In one embodiment, the material formed in the openings in the conductors is itself conductive so as not to reduce the overall capacitance of the structure (C=kA/t, where A equals the area of a conductor).

In general, a ceramic green sheet will lose organics and densify during a high temperature sintering process with a resultant shrinkage of approximately twenty percent. However, even though the ceramic material has a lower CTE than metal (e.g., 7 ppm/C versus 17 ppm/C for nickel), it may be possible to match the ceramic and metal strains. If a ceramic green sheet shrinkage is matched to nine percent, a ceramic layer can be under a compressive stress. A compressive stress will provide adhesion/retention between a ceramic and another layer. In one embodiment, material 2030 may have its CTE tuned to be under a greater compressive stress. In this manner, material 2030 may act to hold a ceramic green sheet in place in a capacitor.

FIG. 21 shows first conductor 2010 and second conductor 2020 having metal/ceramic paste 2030 partially filling openings 2015 and 2025, respectively. One technique for depositing a metal/ceramic paste is through a squeegee operation across the surface of each conductor.

Referring again to FIG. 19, following the introduction of a CTE-matching material and openings formed in the first and second conductors, a dielectric material, such as a ceramic material may be laminated between the conductors (block 1930). FIG. 22 shows ceramic material 2040 disposed between first conductor 2010 and second conductor 2020. Ceramic material 2040 is, for example, barium titanate or barium, strontium titanate having a thickness on the order of one micron or less. Ceramic material 2040 may be deposited between the conductors as a green sheet.

Referring again to FIG. 19, following the lamination of a ceramic material between the first and second conductors, the composite structure is thermally treated to burn-off organics. Representatively, a thermal treatment would involve a temperature range of 300 to 500° C. for a duration of between two hours and a day. The composite structure may be subsequently heat-treated in a reducing atmosphere in order to densify the ceramic material (block 1940).

FIG. 22 shows ceramic layer 2040 between first conductor 2010 and second conductor 2020.

The above description relates to forming capacitor structures within package substrates. Similar techniques may be used in the formation of capacitors in other environments, such as in printed wiring boards (e.g., printed circuit boards).

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:
1. An apparatus comprising:
   a first capacitor structure comprising an integrated capacitor having a first ceramic material disposed between two electrodes; and
   a second capacitor structure comprising an integrated capacitor having a second ceramic material disposed between two electrodes,
   wherein the first ceramic material and the second ceramic material have different operating temperature ratings, and wherein the first capacitor and the second capacitor are integrated into an insulative core substrate, wherein an operating temperature rating of the first ceramic material is greater than an operating temperature rating of the second ceramic material, the first capacitor structure is positioned on a die side of the core substrate, and the second capacitor structure is placed opposite the die side.

2. The apparatus of claim 1, wherein the core substrate had a substantially planar shape, and wherein the first capacitor structure is coupled to a substantially planar surface of the core substrate and the second capacitor structure is coupled to an opposite substantially planar surface of the core substrate.

3. The apparatus of claim 1, wherein the first capacitor structure is positioned into the core substrate for first droop capacitance and the second capacitor structure is positioned for second droop capacitance.

4. The apparatus of claim 1, wherein an operating temperature rating of the first ceramic material is greater than an operating temperature rating of the second ceramic material and wherein the first capacitor structure is disposed within an area defined by the second capacitor structure.

5. The apparatus of claim 1, wherein the first ceramic material has a lower capacitance than the second ceramic material.

6. The apparatus of claim 1, further comprising a microprocessor configured to heat a die side of the substrate with a higher temperature than an opposite side of the substrate from the die side, wherein the first ceramic material has a lower dielectric constant, k, than the second ceramic material, and wherein the first capacitor structure is positioned in locations heated with a higher temperature than locations where the second capacitor structure is placed.

7. A system comprising:
   a computing device comprising a microprocessor, the microprocessor coupled to a printed circuit board through a substrate, the microprocessor configured to heat a die side of the substrate with a higher temperature than an opposite side of the substrate from the die side, the substrate comprising a first capacitor structure comprising a first ceramic material disposed between two electrodes and a second capacitor structure comprising a second ceramic material disposed between two electrodes,
   wherein the first ceramic material and the second ceramic material have different operating temperature ratings, wherein an operating temperature rating of the first ceramic material is greater than an operating temperature rating of the second ceramic material, the die side of the substrate under the microprocessor includes the first capacitor structure, and the second capacitor structure is on the opposite side of the substrate from the die side.

8. The system of claim 7, wherein the first capacitor structure is coupled to a substantially planar surface of the substrate and the second capacitor structure is coupled to an opposite substantially planar surface of the substrate.

9. The system of claim 7, wherein the first capacitor structure is positioned on the core substrate for first droop capacitance and the second capacitor structure is positioned for second droop capacitance.

10. The system of claim 7, wherein an operating temperature rating of the first ceramic material is greater than an operating temperature rating of the second ceramic material and wherein the first capacitor structure is disposed within an area defined by the second capacitor structure.

11. The apparatus of claim 7, wherein the substrate comprises an insulative package substrate disposed between the microprocessor and the printed circuit board.

12. An apparatus comprising:
- a microprocessor configured to heat a die side of the substrate with a higher temperature than an opposite side of the substrate from the die side;
- a first capacitor structure comprising a first plurality of integrated capacitors formed from a same first ceramic material disposed between a first two electrodes and formed on a first generally planar shaped surface of an insulative core substrate; and
- a second capacitor structure comprising a second plurality of integrated capacitors formed from a same second ceramic material disposed between a second two electrodes and formed on a second generally planar shaped surface of the insulative core substrate, wherein the first ceramic material and the second ceramic material have different operating temperature ratings, wherein an operating temperature rating of the first ceramic material is selected to be greater than an operating temperature rating of the second ceramic material and the first capacitor structure is selected to be positioned on the die side of the core substrate, and the second capacitor structure is placed opposite the die side.

13. The apparatus of claim 12, wherein the first surface and the second surface are the same surface of the core substrate.

14. The apparatus of claim 12, wherein the core substrate is an insulative core substrate comprising one of an epoxy material, an organic substrate material, a fiberglass reinforced material, and a pre-preg material.

15. The apparatus of claim 12, wherein the core substrate comprises an insulative material, the first surface and the second surface are opposite surfaces of the core substrate, the first capacitor structure is oriented parallel to the second capacitor structure, the core substrate comprises a package substrate; and further comprising conductive vias formed through the first capacitor structure, the second capacitor structure and the core substrate.

* * * * *

UNITED STATES PATENT AND TRADEMARK OFFICE
CERTIFICATE OF CORRECTION

| | |
|---|---|
| PATENT NO. | : 7,375,412 B1 |
| APPLICATION NO. | : 11/096313 |
| DATED | : May 20, 2008 |
| INVENTOR(S) | : Palanduz et al. |

It is certified that error appears in the above-identified patent and that said Letters Patent is hereby corrected as shown below:

In column 5, at line 45, delete "density" and insert --densify--.

In column 6, at line 4, delete "and" and insert --an--.

Signed and Sealed this

Second Day of December, 2008

JON W. DUDAS
*Director of the United States Patent and Trademark Office*